(12) United States Patent
Suzuki et al.

(10) Patent No.: US 6,333,867 B1
(45) Date of Patent: Dec. 25, 2001

(54) SEMICONDUCTOR STORAGE DEVICE

(75) Inventors: Junnichi Suzuki; Kazuyuki Yamazaki, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/598,475

(22) Filed: Jun. 22, 2000

(30) Foreign Application Priority Data

Jun. 25, 1999 (JP) .................................................. 11-180802

(51) Int. Cl.[7] .............................. G11C 5/06; G11C 17/00
(52) U.S. Cl. .................................. 365/63; 365/104; 365/51
(58) Field of Search .............................. 365/63, 104, 51, 365/52, 94

(56) References Cited

U.S. PATENT DOCUMENTS

| | | | |
|---|---|---|---|
| 5,268,861 | * 12/1993 | Hotta ..................................... | 365/104 |
| 5,295,092 | * 3/1994 | Hotta ..................................... | 365/51 |
| 5,721,698 | * 2/1998 | Lee et al. ............................... | 365/104 |
| 5,825,683 | * 10/1998 | Chang ................................... | 365/104 |
| 5,852,570 | * 12/1998 | Hotta et al. ........................... | 365/104 |
| 6,084,794 | * 7/2000 | Lu et al. ................................ | 365/104 |
| 6,128,210 | * 10/2000 | Suminaga et al. ..................... | 365/63 |

FOREIGN PATENT DOCUMENTS

| | | |
|---|---|---|
| 4-305973 | 10/1992 | (JP) . |
| 2565213 | 10/1996 | (JP) . |

* cited by examiner

*Primary Examiner*—Richard Elms
*Assistant Examiner*—Anh Phung
(74) *Attorney, Agent, or Firm*—McGinn & Gibb, PLLC

(57) ABSTRACT

A semiconductor storage device with high integration is capable of performing high speed access. The semiconductor storage device is constituted in such a way that it causes one contact to be connected with a primary bit-line, further it causes four sub bit-lines to be connected through four bank selection transistor, furthermore, it causes one contact to be connected to a virtual GND line, moreover, it causes two sub bit-lines to be connected through two bank selection transistors. The respective sub bit-lines are arranged in parallel to signal inputted to six bank selection lines, and in parallel to primary bit-line. Two virtual GND lines which are arranged at right and left of the primary bit-line. The memory cell transistor is capable of being selected according to combination of level of the two virtual GND lines. This causes bank selection lines to be reduced, further it causes cell array to be shortened in bit direction, furthermore, it causes cell array area to be reduced.

28 Claims, 10 Drawing Sheets

SEMICONDUCTOR STORAGE DEVICE

BACKGROUND OF THE INVENTION

The present invention relates to a semiconductor storage device such as mask ROM (mask read only memory) and so forth with more high integration and high speed operation. More to particularly, this invention relates to a semiconductor storage device for the sake of the mask ROM in which a plurality of memory cell transistor (Tr) are connected with every one bit contact due to the fact that it causes main/sub bit line constitution and virtual GND system to be adopted in order to realize large capacity mask ROM with high integration and high speed access.

DESCRIPTION OF THE PRIOR ART

Formerly, the semiconductor storage device is applied to various kinds of the fields as, for instance, a mask ROM (mask read only memory). Storage capacity of the mask ROM increases year after year. At present time, the mask ROM of 256 Mbit is generally produced in large quantities.

A unit cell size in the word direction of the NOR type memory cell is determined according to wiring pitch of sub bit-lines and layout pitch of primary bit-lines. These specifications mainly proceed out of process technology such as lithography, etching, and so forth, thus it is difficult to reduce in the circuit. On the other hand, about a unit cell size in the bit-line direction is determined according to following respective items (A), (B), and (C).

(A): wiring pitch of word selection line (B): stage number of the memory cell connected in every one bit contact (C): number of selection line with the exception of word selection line With respect to item (A), it is determined due to etching precision of poly crystal Si constituting the word selection line, therefore it is caused by process. However, with respect to item (B), it is caused by resistance value within current route of 'the primary bit-line' to 'the sub bit-line' to 'the memory cell' to 'the sub bit-line' to 'the bank selection transistor' to 'the virtual GND line' from the sense amplifier on the occasion of cell selection. Further, with respect to item (C), it is caused by number of the bank selection line in every bit contact. For that reason, it is capable of realizing reduction due to the fact that it causes constitution of memory cell array including the bank selection line and or the bank selection transistor.

With respect to the item (C) described above, FIG. 1 shows the conventional example 1, and FIG. 2 shows the conventional example 2 (FIGS. 1, and 2 show only diffusion layer, and bank selection transistors). Concerning the present conventional example 1, the Japanese Patent Application Laid-Open No. HEI 3-142877 discloses the memory cell capable of selecting bank row according to four selection signal lines in every one bit contact. In this case, the diffusion layer to which the sense amplifier charges is one side of selection side within above and below memory cell array of the digit contact. Further, FIGS. 3, and 4 are views for explaining capacitance of diffusion layer of the conventional example 1 and the conventional example 2.

FIGS. 1, and 3 show a flat type cell of the mask ROM of the conventional example 1. The flat type cell of the mask ROM is the conventional constitution example in which it causes part should be charged to be reduced while regarding characteristic important. FIGS. 2 and 4 show the conventional example 2, which is a conventional cell constitution while regarding chip size important. The content of these conventional examples is described in detail while comparing with the embodiment of the present invention.

Further, as the conventional example 3 whose technical field is similar to the present invention, the Japanese Patent Application Laid-Open No. HEI 4-305973 discloses "Semiconductor Storage Device". The conventional example 3 implements selection of memory transistor group of reading target according to the fact that one of two source lines is set to earth level, the other is set to floating state. For that reason, it is capable of reducing the bit-lines to be formed to the memory transistor group, thus improving degree of integration.

However, improvement of integration collides with acquisition of stabilized good characteristic. Consequently, there is the problem that high integration namely, reduction of area in every unit bit is required, while possessing stabilized good characteristic in future mask ROM.

This is considered while employing the conventional example 1, the conventional example 2, and the conventional example 3 which have different characteristic described above. The chip size is not intended to be enlarged as the conventional example 1. The conventional examples 2, and 3 have defect in characteristic. There occurs problem that it causes chip size to be reduced while suppressing deterioration of characteristic.

SUMMARY OF THE INVENTION

In view of the foregoing, it is an object of the present invention, in order to overcome the above-mentioned problem, to provide a semiconductor storage device which is capable of realizing high integration and high speed access.

According to a first aspect of the present invention, in order to achieve the above-described object, there is provided a semiconductor storage device which comprises one contact which is connected to a primary bit-line, five sub bit-lines which are connected to the primary bit-line through four bank selection transistors, one contact which is connected to a virtual GND line, and two sub bit-lines which are connected to the virtual GND line through two bank selection transistors, wherein respective six sub bit-lines are arranged in parallel to signal inputted to six bank selection lines and are arranged in parallel to the primary bit lines, thus selecting memory cell transistor due to combination of level of two virtual grand lines arranged at right and left of the primary bit lines.

According to a second aspect of the present invention, in the first aspect, there is provided a semiconductor storage device, wherein 'right and left' of one sub bit-line with contact connected to the primary bit-line as center is segregated into upper part and lower part with respect to the contact connected to the primary bit-line, and 'right and left' of one sub bit-line with contact connected to the virtual GND line as center is connected by 'above and below' sub bit-line with respect to the contact connected to the virtual GND line.

According to a third aspect of the present invention, in the first or second aspect, there is provided a semiconductor storage device, wherein the virtual GND line is connected to either a pre-charge circuit or GND through a row select transistor controlled by a row selection line and a virtual GND selection transistor controlled by virtual GND selection signal.

According to a fourth aspect of the present invention, there is provided a semiconductor storage device which comprises one contact which is connected to a primary bit-line, two sub bit-lines which are connected to the primary bit-line through two bank selection transistors, one contact which is connected to a virtual GND line, and five sub bitlines which are connected to the virtual GND line through four bank selection transistors, wherein respective six sub bit-lines are arranged in parallel to signal inputted to six bank selection lines and are arranged in parallel to the primary bit lines, thus selecting memory cell transistor due to combination of level of two virtual grand lines arranged at right and left of the primary bit lines.

According to a fifth aspect of the present invention, in the fourth aspect, there is provided a semiconductor storage device, wherein 'right and left' of one sub bit-line with contact connected to the primary bit-line as center is connected by 'above and below' sub bit-line with respect to the contact connected to the primary bit-line, and 'right and left' of one sub bit-line with contact connected to virtual GND line the as center is segregated into upper part and lower part with respect to the contact connected to the virtual GND line.

According to a sixth aspect of the present invention, in the fourth or fifth aspect, there is provided a semiconductor storage device, wherein the virtual GND line is connected to either a pre-charge circuit or GND through a row select transistor controlled by a row selection line and a virtual GND selection transistor controlled by virtual GND selection signal.

According to a seventh aspect of the present invention, there is provided a semiconductor storage device in which there is provided one primary bit line and two virtual GND lines within one memory cell array, which comprises a virtual GND contact for connecting electrically the memory cell array with the virtual GND line, a bank selection transistor connected with the virtual GND contact, and a bank row selection line for inputting signal to a gate electrode of the bank selection transistor, wherein it causes any one of the plurality of memory cell array to be selected by controlling input of the signal.

According to an eighth aspect of the present invention, in the seventh aspect, there is provided a semiconductor storage device, which further comprises a bit-line contact for connecting electrically the primary bit-line with the memory cell array, wherein the one memory cell array is constituted with symmetry with respect to the center line having the bit-line contact, further, the respective two virtual GND lines have two the virtual GND contacts, furthermore, a virtual GND contact corresponding to the virtual GND contact is connected to the virtual GND contact in the memory cell array adjacent to the memory cell array.

According to a ninth aspect of the present invention, in the seventh or eighth aspect, there is provided a semiconductor storage device, which further comprises a sub bit-line which is connected with the bit line contact, and total four bank selection transistors which are connected with both end parts of the sub bit-line in such a way that respective two transistors are connected in every both ends of the sub bit lines, wherein respective gate electrodes of the four bank selection transistors are connected with respective separate bank row selection lines.

According to a tenth aspect of the present invention, in the seventh or eighth aspect, there is provided a semiconductor storage device, which further comprises two bank selection transistors connected with the bitline contact, wherein respective gate electrode of the two bank selection transistors are connected with respective separate bank row selection line.

According to an eleventh aspect of the present invention, in any of the seventh to the tenth aspect, there is provided a semiconductor storage device, which further comprises a first, a second, a third, a fourth, a fifth, a sixth, a seventh, an eighth, a ninth, and a tenth sub bit-lines in parallel to the primary bit lines; and a plurality of stages of the memory cell transistor provided in between each of the first, the second, the third, the fourth, the fifth, sub bit-line and each of the sixth, the seventh, the eighth, the ninth, the tenth, sub bit-line, wherein the first, the third, the fifth, the sixth, the eighth, and the tenth of the sub bit-lines are connected with respective separate the bank selection transistors.

According to a twelfth aspect of the present invention, in any of the seventh to eleventh aspect, there is provided a semiconductor storage device, wherein there is provided a plurality of stages of the memory cell transistor in between the first, the second, the third, the fourth, the fifth of the sub bit-lines and the sixth, the seventh, the eighth, the ninth, the tenth of sub bit-lines.

The above and further objects and novel features of the invention will be more fully understood from the following detailed description when the same is read in connection with the accompanying drawings. It should be expressly understood, however, that the drawings are for purpose of illustration only and are not intended as a definition of the limits of the invention.

DETAILED DESCRIPTION OF THE PREFERRED EMBODIMENTS

Figure 1:
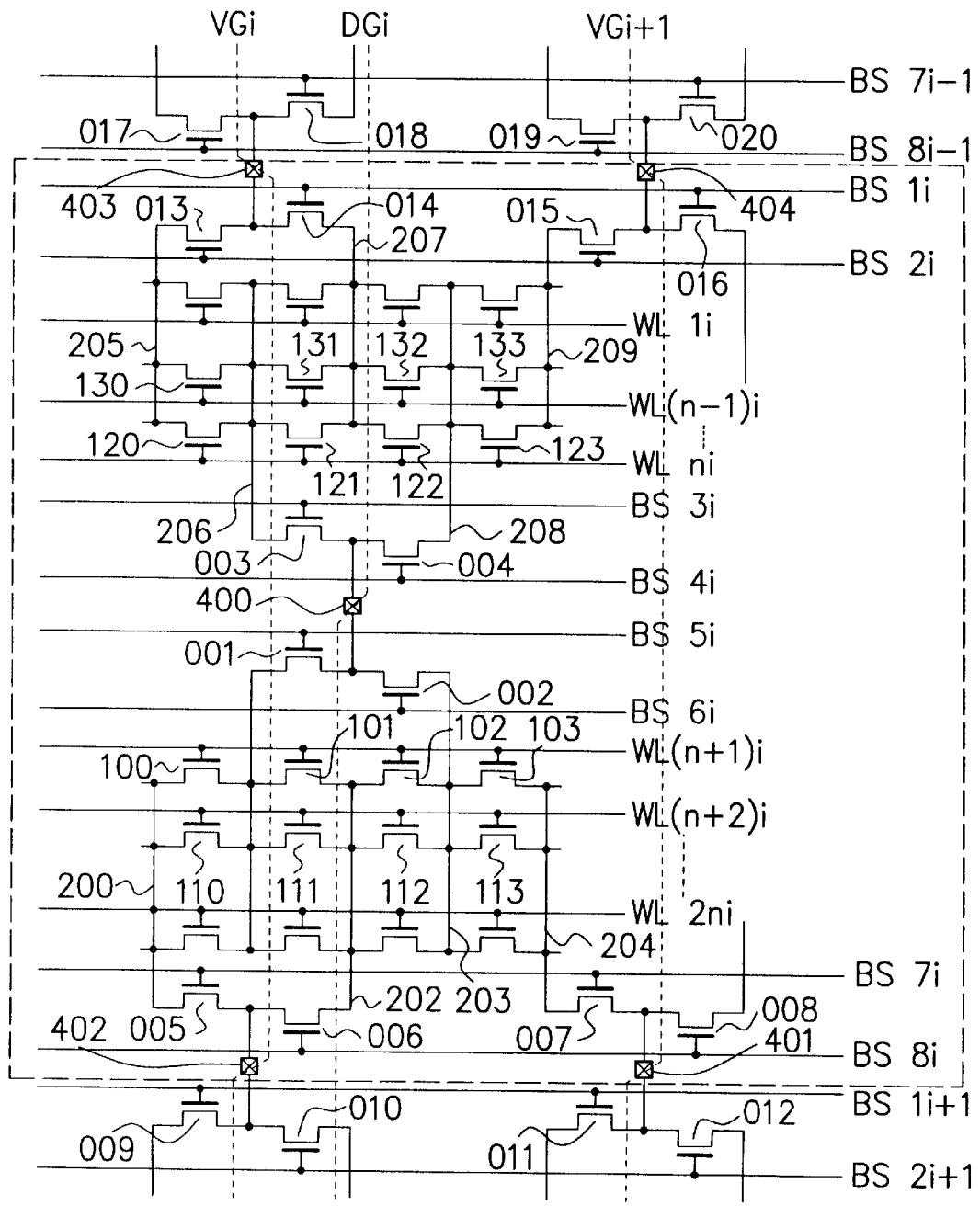
FIG. 1 is a view showing an equivalent circuit of a memory cell array for the sake of the mask ROM of the conventional example 1.

A preferred embodiment of the semiconductor storage device of the present invention will now be described in detail accompanying the drawings. Referring to the drawings FIGS. 5 to 10, one embodiment of the semiconductor storage device of the present invention is shown.

Figure 5:
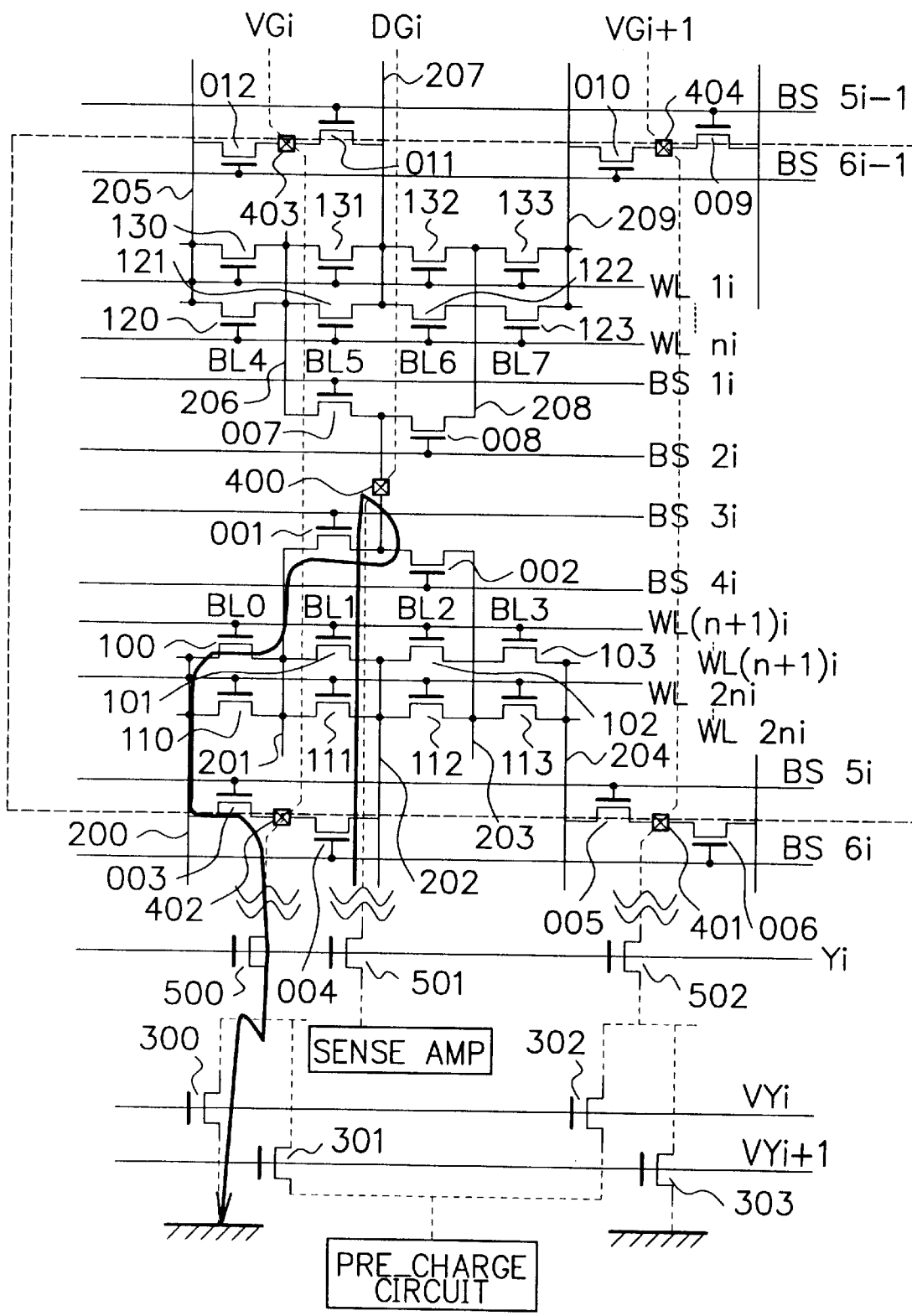
FIG. 5 is a view showing an equivalent circuit of a memory cell array for the sake of mask ROM to which the first embodiment of a semiconductor storage device of the present invention is applied.
Figure 6:
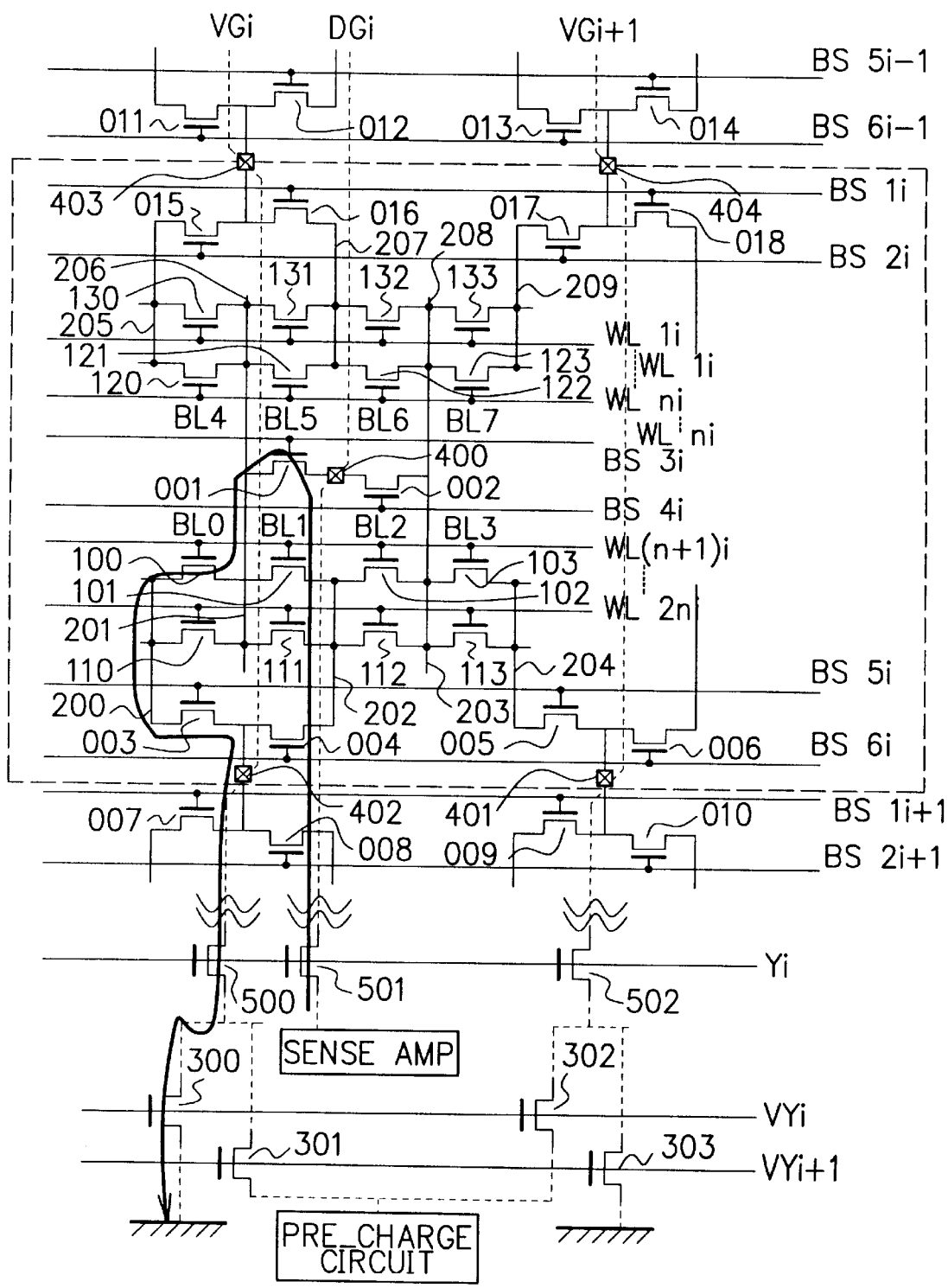
FIG. 6 is a view showing an equivalent circuit of a memory cell array for the sake of mask ROM to which the second embodiment of a semiconductor storage device of the present invention is applied.
Figure 7:
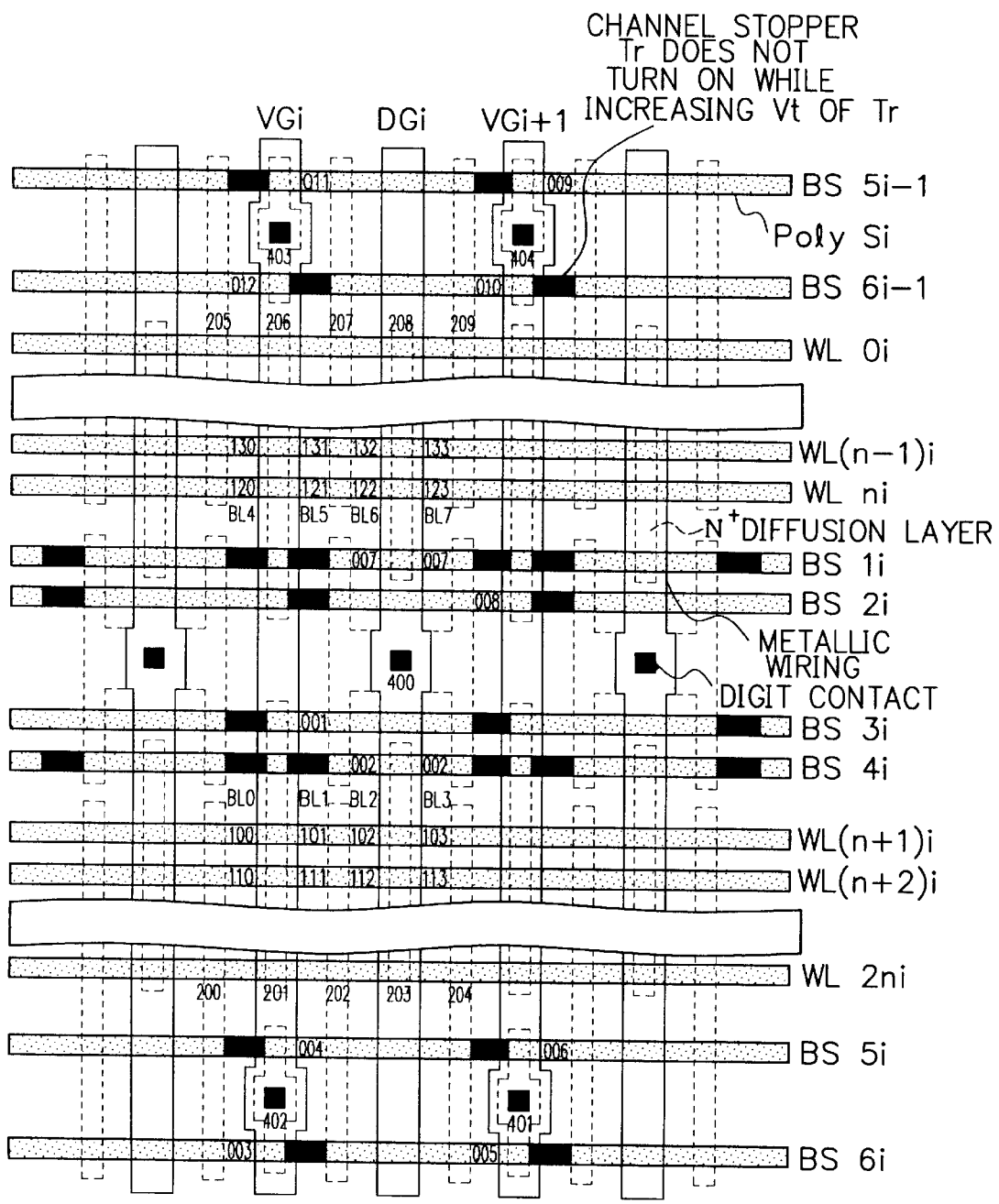
FIG. 7 is a view showing an image for layout of the first embodiment.
Figure 8:
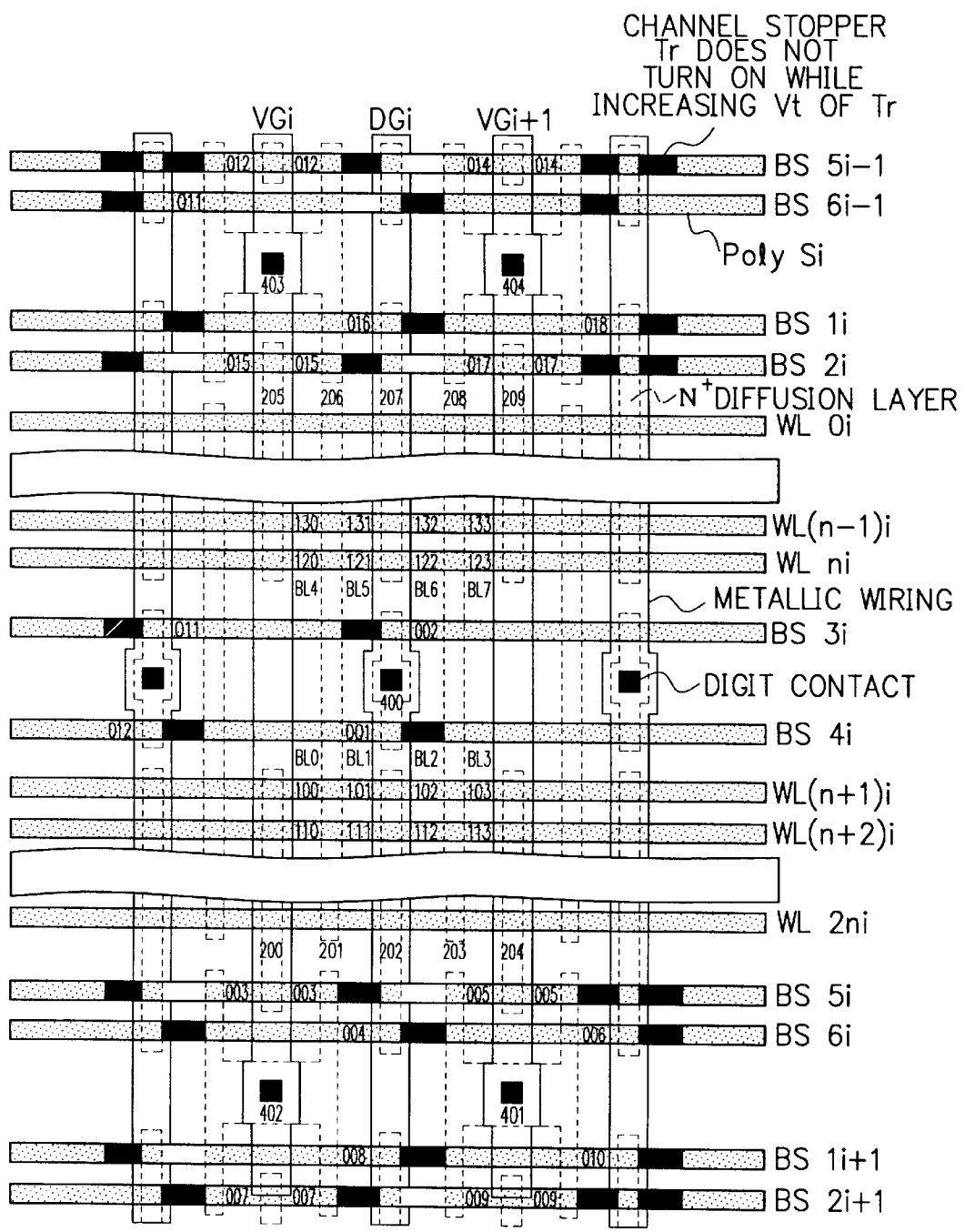
FIG. 8 is a view showing an image for layout of the second embodiment.

FIGS. 5 and 6 are circuit views showing equivalent circuit of the memory cell array for the sake of the mask ROM to which the embodiment of the present invention is applied. Further, FIG. 7 is a layout view corresponding to FIG. 5. FIG. 8 is a layout view corresponding to FIG. 6. Furthermore, in FIGS. 7, and 8, the areas which are painted by black are channel stoppers. A transistor (Tr) is formed on this area. A 'Vt' value (threshold value of voltage of transistor) is set high. The 'Vt' of the transistor (Tr) is set high because of ion injection. Thus, the transistor does not turn ON although the word line becomes high level.

FIGS. 5 and 7 show the first embodiment of the semiconductor storage device according to the present invention. The first embodiment of the semiconductor storage device comprises bank selection transistors (Nch) 001 to 012, memory cell transistors (Nch) 100 to 103, 110 to 113, 120 to 123, and 130 to 133, sub-bit lines (N+diffusion layer) 200 to 209, virtual GND selection transistors (Nch) 300 to 303, Al_N+diffusion layer contacts (bit-line contact) 400 to 404, row selection transistor (Nch) 500 to 502, word selection line Wlni (n is integer more than 1: Poly-Si wiring), bank selection line BSni (n is integer more than 1: Poly-Si wiring), virtual grand line VGi (Al wiring), primary bit-line DGi (Al wiring), bank line BL0 to BL7, row selection line Yi, and virtual GND selection line VYi and VYi+l.

FIGS. 6 and 8 show the second embodiment of the semiconductor storage device according to the present invention. The second embodiment of the semiconductor storage device comprises bank selection transistors (Nch) 001 to 018, memory cell transistors (Nch) 100 to 103, 110 to 113, 120 to 123, and 130 to 133, sub-bit lines (N+diffusion layer) 200 to 209, virtual GND selection transistors (Nch) 300 to 303, Al_N+diffusion layer contacts (bit-line contact) 400 to 404, row selection transistor (Nch) 500 to 502, word selection line Wlni (n is integer more than 1: Poly-Si wiring), bank selection line BSni (n is integer more than 1: Poly-Si wiring), virtual grand line VGi (Al wiring), primary bit-line DGi (Al wiring), bank line BL0 to BL7, row selection line Yi, and virtual GND selection line VYi.

In FIGS. 5, and 6, the primary bit line DGi, the first virtual GND lines arranged at right and left in parallel of the primary bit line DGi, and the second virtual GND line VGi+l are formed by metallic wiring.

The row select transistor 501 is controlled by the row selection line Yi. The primary bit line DGi is connected to a sense amplifier (SENSE AMP) of current detection type through the row select transistor 501.

The row select transistor 500 is controlled by the row selection line Yi. The virtual GND selection transistors 300, 301, 302, and 303 are controlled by the row select transistor 502 and the virtual GND selection signal line VYi. The virtual GND line VGi and the virtual GND line VGi+l connected to a pre-charge circuit (PRE_CHARGE CIRCUIT) or GND through the row select transistor 500 or the virtual selection transistors 300, 301, 302, and 303.

Further, the sub-bit lines 200 to 209 arranged in parallel to the primary bit line and the virtual GND line are formed by N+diffusion layer. The word selection line WLni which is arranged at right angle to the sub-bit line, and the bank selection line BSni are formed by multi-crystalline silicon wiring.

With respect to the memory cell transistors 100 to 133, the cross parts of the sub-bit line and the word selection line are taken to be drains or source electrodes, and part intervening between the cross parts is taken to be a channel. In the diffusion process, the threshold value voltage is set beforehand according to the state whether or not it causes injection of impurity ion of P-type at the channel part of the memory cell. A bank line is a memory cell group which is formed by two adjacent sub bit-lines and a plurality of word selection lines. The plurality of bank lines are connected to one primary bit-line through the bank selection transistors 001 to 018. In FIGS. 5, and 6, there are total eight bank lines as follows:

1) bank line BL0 formed by sub bit-lines 200 and 201
2) bank line BL1 formed by sub bit-lines 201 and 202
3) bank line BL2 formed by sub bit-lines 202 and 203
4) bank line BL3 formed by sub bit-lines 203 and 204
5) bank line BL4 formed by sub bit-lines 205 and 206
6) bank line BL5 formed by sub bit-lines 206 and 207
7) bank line BL6 formed by sub bit-lines 207 and 208
8) bank line BL7 formed by sub bit-lines 208 and 209

Above-described respective eight bank lines have the following connection relationship. Namely, the sub bit-lines 201, 203, 206, and 208 form drain electrodes of respective bank lines. One end of the sub bit-lines 201, 203, 206, 208 is connected to the primary bit-line DGi through respective bank selection transistors 001, 002, 007, 008 (in FIG. 6 001, 002) and the bit-line contact 400.

The sub bit-lines 200, 202 form source electrodes of the bank line BL0, BL1. One end of the sub bit-lines 200, 202 is connected to virtual GND line VGi through the bank selection transistors 003, 004 and the virtual GND contact 402.

The sub bit-lines 205, 207 form source electrodes of the bank lines BL5, BL6. One end of the sub bit-lines 205, 207 is connected to the virtual GND line VGi through the bank selection transistors 011, 012 (in FIG. 6, 015, 016) and the virtual GND contact 403.

The sub bit-line 204 forms a source electrode of the bank line BL3. One end of the sub bit-line 204 is connected to the virtual GND line VGi+l through the bank selection transistor 005 and the virtual GND contact 401.

The sub bit-line 209 forms a source electrode of the bank line BL7. One end of the sub bit-line 209 is connected to the virtual GND line VGi+l through the bank selection transistor 010 (in FIG. 6, 017) and the virtual GND contact 404. The Al_N+ diffusion layer contacts 401 to 404 are the virtual GND contact (in FIG. 6, bit-line contact). The right and left sub bit-lines (in FIG. 5, 200, 202, 204, 205, 207, and 209, in FIG. 6, 201, 203, 206, and 208) of the Al_N+ diffusion layer contacts 401 to 404 are connected to the memory cell array positioned at above and below of the respective virtual GND contacts (in FIG. 6, digit contact). The right and left sub bit-lines put the digit contact (in FIG. 6, virtual GND contact) therebetween. The right and left sub bit-lines are not connected to the above and below memory cell array, but being disconnected thereto.

The respective bank selection transistors cause the bank selection line formed by multi-crystalline Si wiring to be gate input. The sub bit-line of the drain side of one line of the bank line is connected to the primary bit-line, and the sub bit-line of the source side is connected to the VGi and VGi+l from among 8 rows of bank lines according to combination of the bank selection lines.

Above-described 8-bank rows BL0 to BL7 and the bit-line contact 400, the virtual GND contacts 401, 402, 403, 404, the bank selection transistors 001 to 018, the primary bit-line DGi, the virtual GND line VGi, the virtual GND line VGi+l of constitution of the cell array are taken to be fundamental unit. The fundamental unit is arranged repeatedly in bit direction and the word direction, thus large capacity of the memory cell is constituted.

OPERATION

Hereinafter, there will be described operation of the first embodiment of the semiconductor storage device according to the present invention in detail referring to the drawing. In the first embodiment shown in FIG. 5, it causes the memory cell transistor 100 to be selected. On this occasion, it causes the row selection line Yi to be H level before causing the primary bit-line to be connected to sense amplifier circuit, and causing the virtual GND line Vgi, the virtual GND line VGi+l to be selection state. Next, the semiconductor storage device causes the virtual GND selection line VYi to be H level. The semiconductor storage device causes the virtual GND selection line VYi+l to be L level. The semiconductor storage device causes the first virtual ground line VGi to be grounded. The second virtual GND line VGi+l is connected to a pre-charge circuit to make it pre-charge level. Subsequently, it causes bank selection line BS3i, bank selection line BS5i to be H level. It causes the bank selection transistors 001, 003, 005 to be activated to make it ON state. Furthermore, it causes the whole remaining bank selection lines to be L level.

According to the above-described operation, the drain side sub bit-line 201 of the bank row BL1 including selection memory cell transistor 100 is connected to the primary bit line DGi through the bank selection transistor 001. Further, simultaneously, the sub bit-line 200 at the source side of the bank row BL1 including the selection memory cell transistor 100 is connected to the virtual GND line VGi through the bank selection transistor 003, and the selection cell 100 is connected to the virtual GND line VGi+l through bank selection transistor 003.

Here, the semiconductor storage device causes the word selection line WL(n+l)i to be H level, which forms the gate input of the memory cell transistor 100 to be attempted to select, consequently causing the other whole word selection lines to be L level. For that reason, the memory cell transistors 100, 101, 102, and 103 become activated state. On this occasion, current PASS1 of 'the sense amplifier' to 'the row selection transistor 501' to 'the primary bit-line DGi' to 'the bit-line contact 400' to 'the bank selection transistor 001' to 'the sub bit-line 201' to 'the memory cell transistor 100' to 'the sub bit-line 200' to 'the bank selection transistor 003' to 'the bit-line contact 402' to 'the virtual GND line VGi' to 'the row selection transistor 500' to 'the virtual GND selection transistor 300' to 'GND' is formed.

Further, current PASS2 of 'the sense amplifier' to 'the row selection transistor 501' to 'the primary bit-line DGi' to 'the bit-line contact 400' to 'the bank selection transistor 001' to 'the sub bit-line 201' to 'the memory cell 101' to 'the memory cell 102' to 'the memory cell 103' to 'the sub bit-line' to 'the bank selection transistor 005' to 'the bit-line contact 401' to 'the virtual GND line VGi+l' to 'the row selection transistor 502' to 'the virtual GND selection transistor 302' to 'the pre-charge circuit' is formed.

With respect to the current PASS 2, it is capable of breaking the current PASS due to the fact of pre-charging by the pre-charge circuit. According to the above described matter, when the threshold voltage of the memory cell transistor 100 is set to the value more than a power-supply voltage VDD in the diffusion process, the memory cell transistor 100 does not come into ON state. For that reason, DC current does not flow into the current PASS 1. Such the cell is called as OFF cell. On this occasion, the sub bit-line which should be charged from the side of the sense amplifier is only the side of the selection memory cell array from among above and below memory cell array. Conversely, when it causes threshold value of the memory cell transistor 100 to be set to initial 'Vt' of a substrate in the diffusion process, the memory cell transistor 100 becomes ON state, thus DC current flows into the current PASS 1. Such the cell is called as ON cell. In the sense amplifier, '1', '0' data judgement becomes possible, due to the fact that it causes above described current to be detected.

Operation of the second embodiment is the same as that of the embodiment roughly. Not only it causes one sub bit-line 201 to be charged from the side of the sense amplifier, but also it causes the other sub bit-line 206 to be charged. However, the sub bit-line which should be charged from the pre-charge side becomes only one side of above and below block of the memory cell array.

EFFECT

Above-described the first and the second embodiments bring a first effect that it is capable of being reduced bank selection line by total two in comparison with the cell constitution of FIG. 1 of the conventional example 1. For instance, it causes the part surrounded by respective dot lines of FIG. 5, FIG. 6, and FIG. 1 to be the unit, thus such the unit is repeated in the direction of the word selection line and/or in the direction of the bit-line. As example of n=32, in the conventional example 1 (FIG. 1), the word line number in the vertical direction including bank selection line is 72 (32×2+4×2=72). However, in the first and the second embodiments, the word line number in the vertical direction including bank selection line is 70 (32×2+4+2=70). Thus, it enable cell array to be shortened by 3% in the bit direction. For that reason, it enables sell array area to be reduced by 3%.

Figure 2:
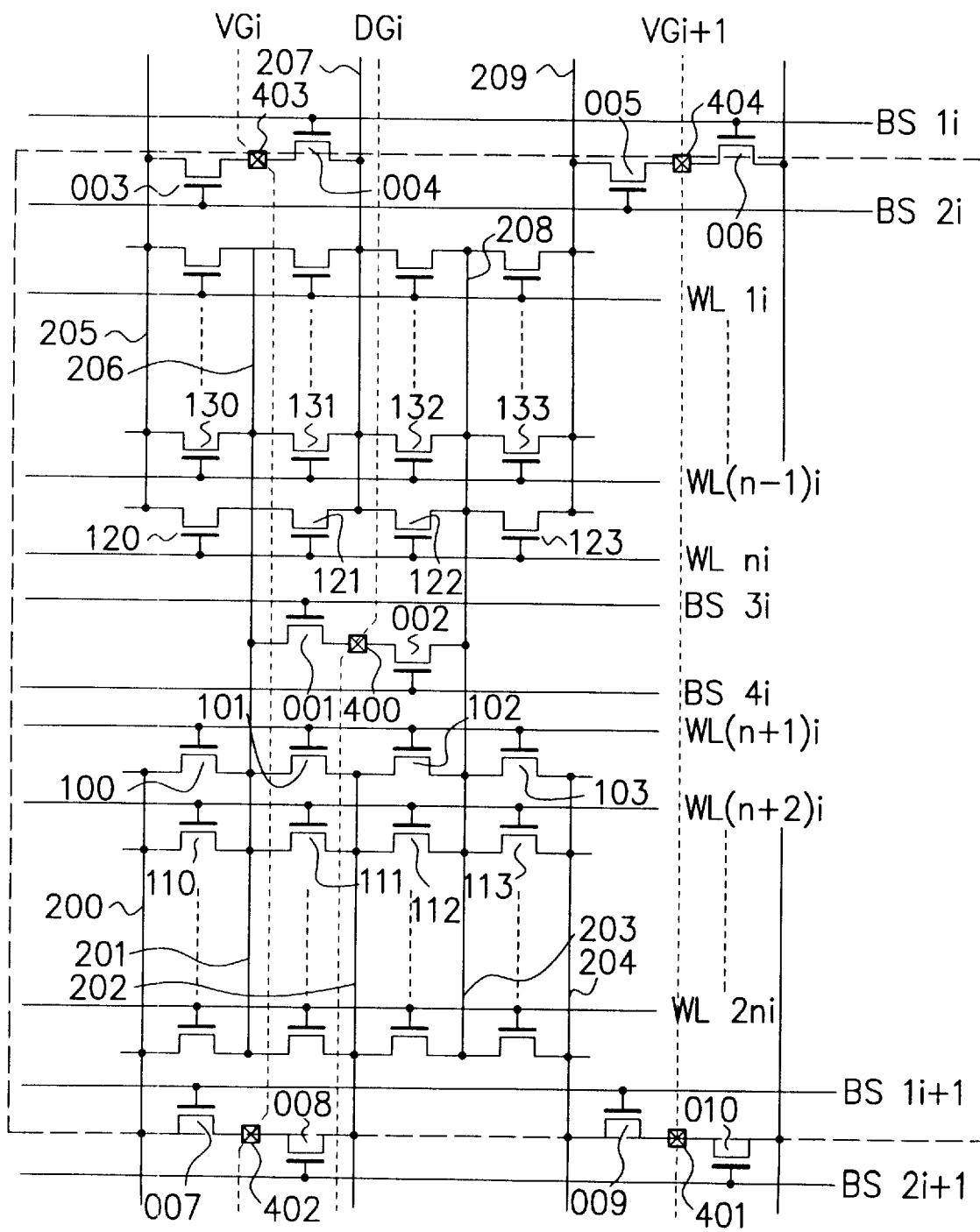
FIG. 2 is a view showing an equivalent circuit of a memory cell array for the sake of the mask ROM of the conventional example 2.
Figure 3:
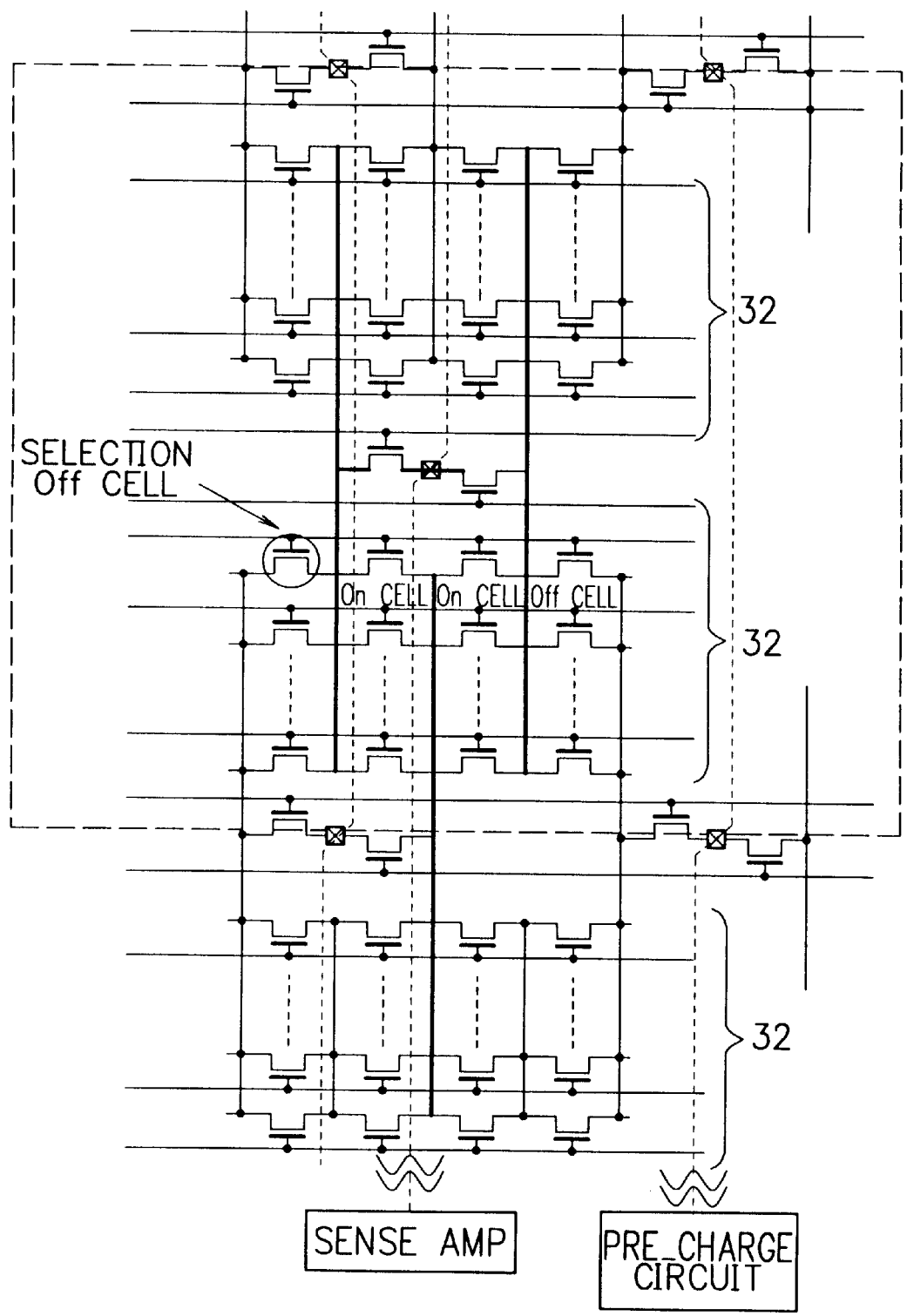
FIG. 3 is a view for explaining diffusion layer capacitance on the occasion of OFF cell selection of the conventional example 1.

Further, a second effect according to the above-described the first embodiment is that the capacity of the diffusion layer which the sense amplifier should charge is diminished in comparison with the cell constitution of the conventional example 2 (FIG. 2). For that reason, there can be obtained the semiconductor storage device with high speed operation and low dissipation power. On the supposition that it causes the capacity of the diffusion layer in every unit length to be Ap F/m square and it causes the distance between word line center and word line center to be B$\mu$m. On the supposition that it causes the part surrounded by respective dot lines of FIG. 5, FIG. 6, and FIG. 1 to be the unit, in the conventional example 2. In respect to the length of the N+diffusion layer, when it causes the word line constitution to be 32×2 in every unit cell array, the maximum capacity of the diffusion layer should be charged by only the sense amplifier becomes 198 AB pF ((32+1)×6 ×A×B) (broad line part of FIG. 3).

Figure 9:
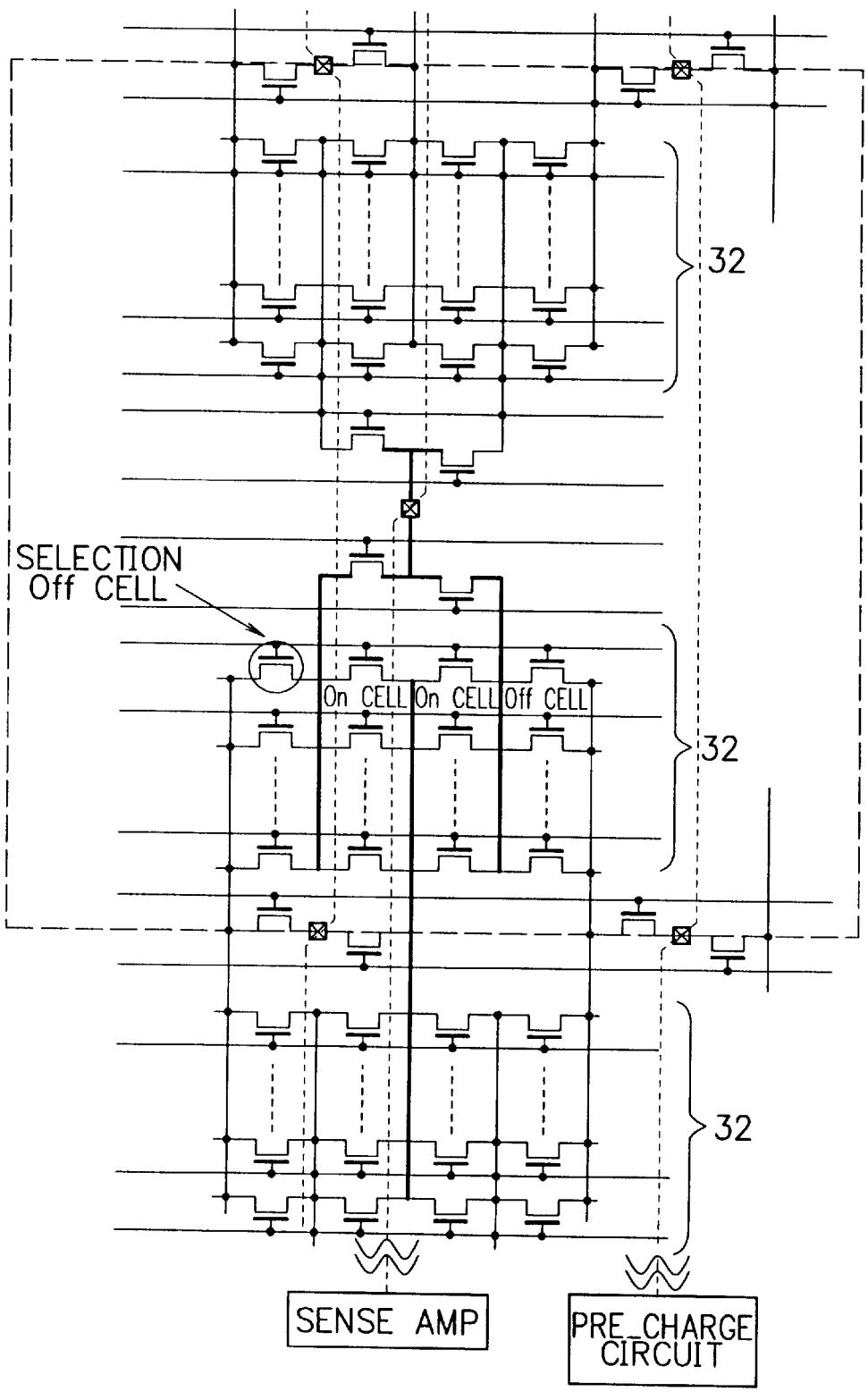
FIG. 9 is a view for explaining diffusion layer capacitance on the occasion of OFF cell selection of the first embodiment.

FIG. 9 is a view showing layout of the ON cell, the OFF cell which are charged by only the sense amplifier. FIG. 9 is the view for explaining capacity of diffusion layer on the occasion of OFF cell selection of the first embodiment. In the first embodiment, the diffusion layer which should be charged in the maximum value becomes broad line part of FIG. 9. The capacitance value thereof becomes 133 AB pF (((32+1)×4+1)×A×B). Such the capacitance value becomes about ⅔ to the value of the conventional example 2.

Figure 10:
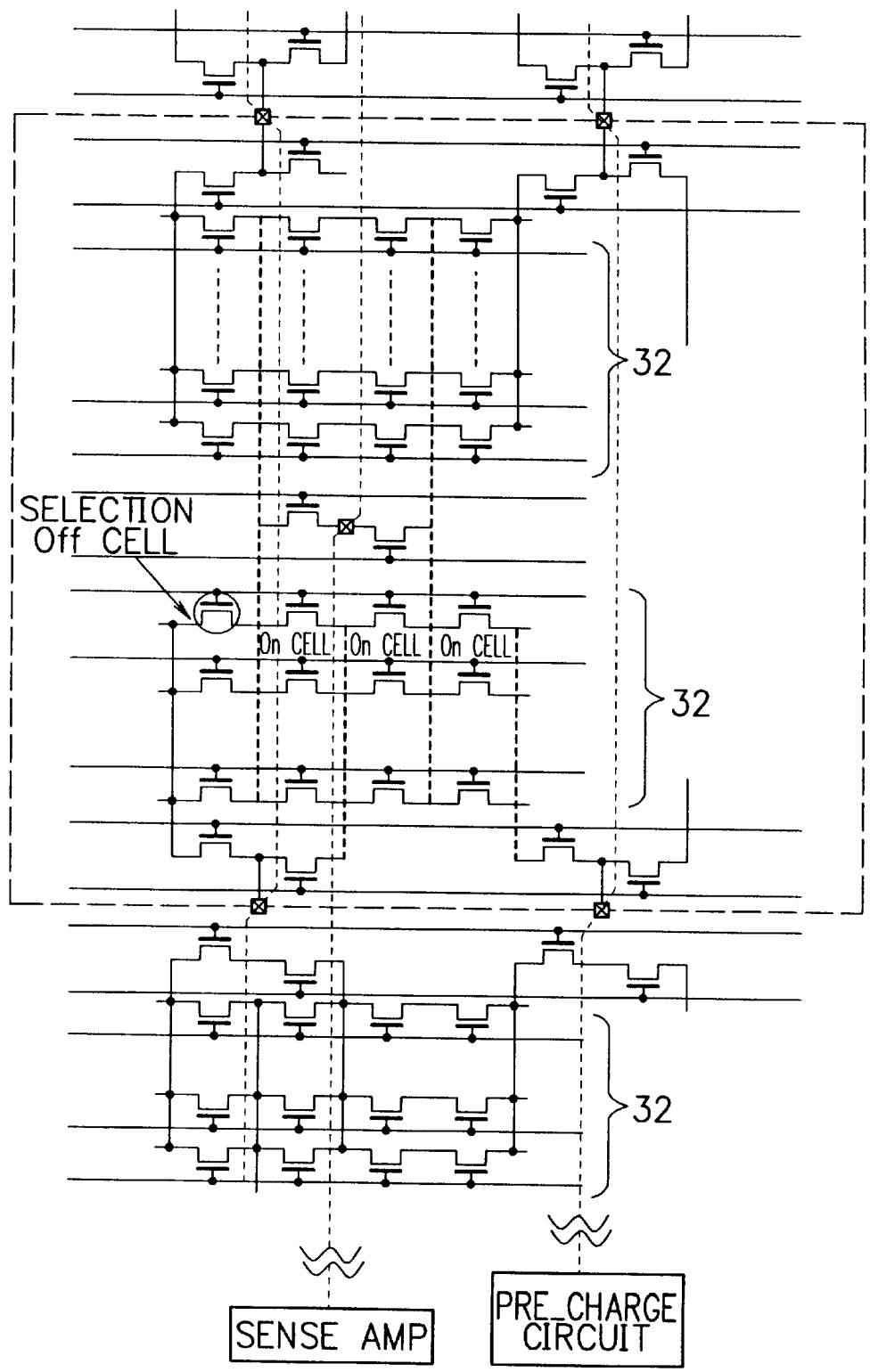
FIG. 10 is a view for explaining diffusion layer capacitance on the occasion of OFF cell selection of the second embodiment.

Further, above-described the second embodiment brings the third effect. The capacitance of the diffusion layer is reduced when the sense amplifier and the pre-charge circuit charge in comparison with the cell constitution of FIG. 2 of the conventional example 2. For that reason, there can be obtained the semiconductor storage device with more higher speed operation and lower dissipation power. FIG. 10 is a view showing layout of the ON cell, and the OFF cell which the pre-charge and the sense amplifier charge. FIG. 10 is the view for explaining the capacitance of the diffusion layer on the occasion of OFF cell selection of the second embodiment.

Figure 4:
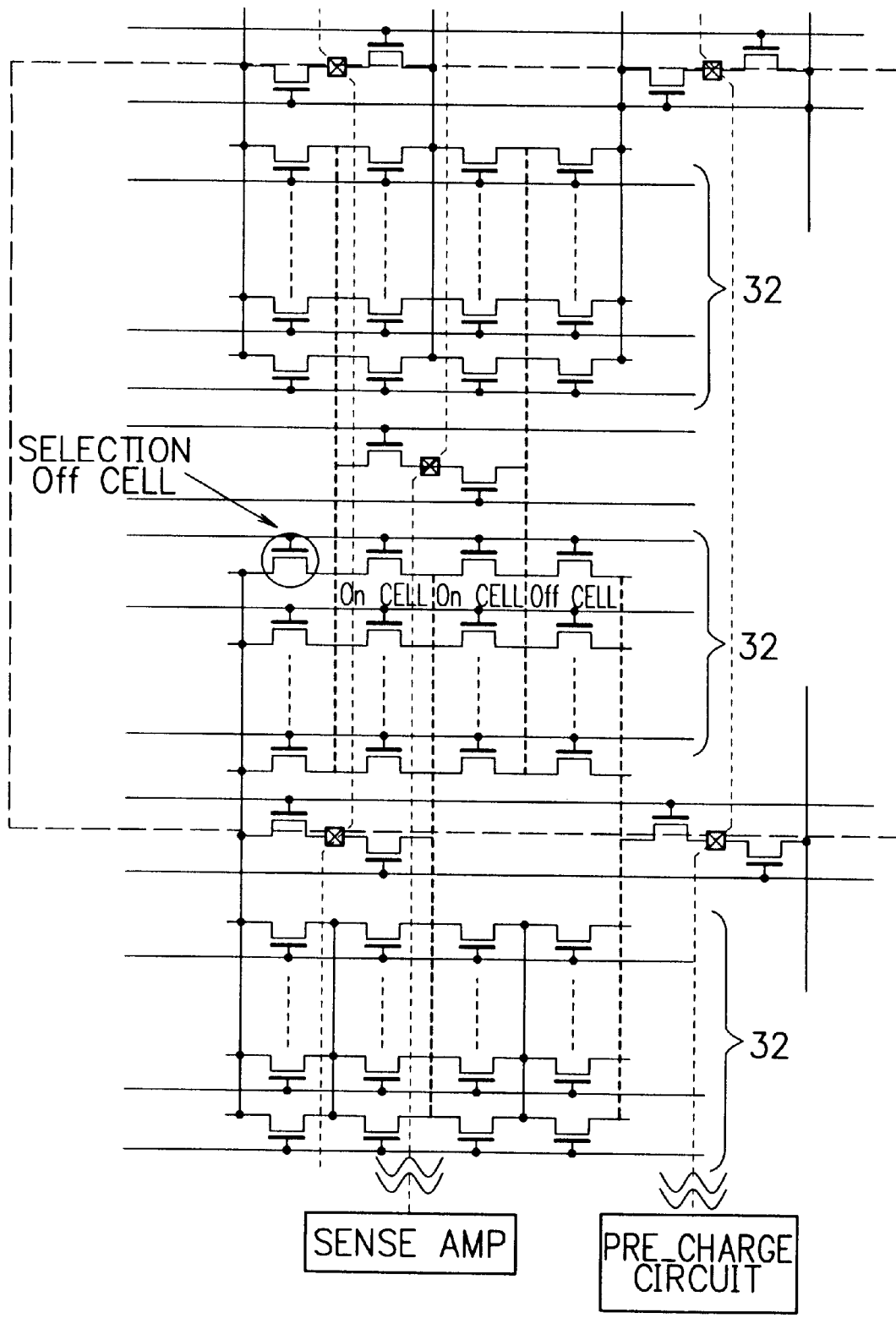
FIG. 4 is a view for explaining diffusion layer capacitance on the occasion of OFF cell selection of the conventional example 2.

FIG. 10 shows the second embodiment. FIG. 4 shows the conventional example 2. The both thereof show the capacitance of the diffusion layer which is charged by the circuit of both of the sense amplifier and the pre-charge. More concretely, FIG. 10 shows layout of both of the ON cell and the OFF cell which the pre-charge and the sense amplifier charge, thus FIG. 10 is the view for explaining the capacitance of the diffusion layer on the occasion of the OFF cell selection of the second embodiment. Furthermore, FIG. 4 showing the conventional example 2 corresponds to FIG. 10. From FIG. 10, the capacitance of the diffusion layer becomes 198 A pF (((32+1)×6)×A). In the case of FIG. 2 of the conventional example 2, the capacitance of the diffusion layer becomes 264 A pF (((32+1)×8)×A) as shown in FIG. 4. The difference of 66 A pF is added inevitably.

ANOTHER EMBODIMENT

In the practical large capacity of mask ROM device, it causes the memory cell array equivalent circuit in the first and the second embodiments shown in FIGS. 5, and 6 to be fundamental unit. The memory cell is configured by the fundamental unit while being arranged repeatedly in the direction of the word line and/or in the direction of the bit-line. Now, there will be described the third embodiment constituted in such a way that it causes the first embodiment or the second embodiment of the semiconductor storage device according to the present invention to be arranged repeatedly as described above hereinafter.

In the present third embodiment, referring to FIG. 5, on the supposition that 32 memory cells are arranged in the direction of the bit-line at the one bank row. On the supposition that it causes the fundamental unit to be 4 bits of the memory cell with respect to the word line direction, and it causes the fundamental unit to be two bank rows (corresponding to 64 bits of memory cell) with respect to bit line direction. In this case, when, for instance, it causes the memory cell of 2 M bits to be configured, it is capable of being realized by arranging the memory cell array of the fundamental unit corresponding to 256 blocks in the direction of the word line, and corresponding to 32 blocks in the direction of bit line.

In the memory cell array for the sake of the mask ROM of the above-described third embodiment, in order to realize large capacity mask ROM with high integration and high speed access, it causes primary/sub bit-line constitution and virtual GND system to be adopted. For that reason, in the NOR type cell for the sake of the mask ROM in which a plurality of the memory cell transistors are connected to every one bit contact, it is capable of reducing the cell array area with respect to the conventional example 1, further, it is capable of reducing the capacitance of diffusion layer to be charged on the occasion of OFF cell selection with respect to conventional example 2 as shown in FIG. 2.

As is clear from the description described above, in the semiconductor storage device of the present invention, which is constituted in such a way that it causes the contact to be connected to the primary bit line, further, it causes the sub bit-line to be connected through the bank selection transistor, furthermore, it causes the contact to be connected to the virtual GND line, moreover, it causes the sub bit-line to be connected through the bank selection transistor. The respective sub bit-lines are arranged in parallel to the signal inputted to the bank selection line and the primary bit-line. It is capable of selecting the memory cell transistor due to combination of level of the virtual GND lines arranged at right and left of the primary bit-line. For that reason, it enables the bank selection limes to be reduced, further, it enables the cell array to be shortened in the bit direction, furthermore, it enables the cell array area to be reduced.

Moreover, the capacitance of diffusion layer which the sense amplifier should charge is diminished in comparison with the cell constitution of the prior art. For that reason, it is capable of being obtained the semiconductor storage device with high speed operation and low dissipation power. Still moreover, the capacitance of diffusion layer is diminished when the sense amplifier and the pre-charge circuit charge in comparison with the cell constitution of the prior art. For that reason, it is capable of being obtained the semiconductor storage device with high speed operation and low dissipation power.

While preferred embodiments of the invention have been described using specific terms, the description has been for illustrative purpose only, and it is to be understood that changes and variations may be made

What is claimed is:

1. A semiconductor storage device comprising:
   one contact which is connected to a primary bit-line;
   five sub bit-lines which are connected to the primary bit-line through four bank selection transistors;
   one contact which is connected to a virtual GND line; and
   two sub bit-lines which are connected to the virtual GND line through two bank selection transistors,
   wherein a respective six sub bit-lines are arranged in parallel to a signal inputted to six bank selection lines and are arranged in parallel to the primary bit lines, thus selecting memory cell transistor due to a combination of a logic level of two virtual ground lines arranged at right and left of the primary bit lines.

2. A semiconductor storage device as claimed in claim 1, wherein 'right and left' of one sub bit-line with contact connected to the primary bit-line as center is segregated into upper part and lower part with respect to the contact connected to the primary bit-line, and 'right and left' of one sub bit-line with contact connected to the virtual GND line as center is connected by 'above and below' sub bit-line with respect to the contact connected to the virtual GND line.

3. A semiconductor storage device comprising:
   one contact which is connected to a primary bit-line;
   five sub bit-lines which are connected to the primary bit-line through four bank selection transistors;
   one contact which is connected to a virtual GND line; and
   two sub bit-lines which are connected to the virtual GND line through two bank selection transistors,
   wherein a respective six sub bit-lines are arranged in parallel to a signal inputted to six bank selection lines and are arranged in parallel to the primary bit lines, thus selecting memory cell transistor due to a combination of a logic level of two virtual ground lines arranged at right and left of the primary bit lines and the virtual GND line is connected to either a pre-charge circuit or GND through a row select transistor controlled by a row selection line and a virtual GND selection transistor controlled by virtual GND selection signal.

4. A semiconductor storage device comprising:
one contact which is connected to a primary bit-line;
five sub bit-lines which are connected to the primary bit-line through four bank selection transistors;
one contact which is connected to a virtual GND line; and
two sub bit-lines which are connected to the virtual GND line through two bank selection transistors,
wherein a respective six sub bit-lines are arranged in parallel to a signal inputted to six bank selection lines and are arranged in parallel to the primary bit lines, thus selecting memory cell transistor due to a combination of a logic level of two virtual ground lines arranged at right and left of the primary bit lines,
'right and left' of one sub bit-line with contact connected to the primary bit-line as center is segregated into upper part and lower part with respect to the contact connected to the primary bit-line as center is segregated into upper part and lower part with respect to the contact connected to the primary bit-line, and 'right and left' of one sub bit-line with contact connected to the virtual GND line as center is connected by 'above and below' sub bit-line with respect to the contact connected to the virtual GND line, and
the virtual GND line is connected to either a pre-charge circuit or GND through a row select transistor controlled by a row selection line and a virtual GND selection transistor controlled by virtual GND selection signal.

5. A semiconductor storage device in which there is provided one primary bit line and two virtual GND lines within one memory cell array, comprising:
a virtual GND contact for connecting electrically the memory cell array with the virtual GND line;
a bank selection transistor connected with the virtual GND contact; and
a bank row selection line for inputting a signal to a gate electrode of the bank selection transistor,
wherein the bank row selection line causes any one of a plurality of memory cell arrays to be selected by controlling input of the signal and a respective six sub bit-lines are arranged in parallel to the signal inputted to six bank selection lines and are arranged in parallel to the primary bit lines, thus selecting memory cell transistor due to a combination of a logic level of two virtual ground lines arranged at right and left of the primary bit lines.

6. A semiconductor storage device as claimed in claim 5, further comprising:
a sub bit-line which is connected with the bit line contact; and
total four bank selection transistors which are connected with both end parts of the sub bit-line in such a way that respective two transistors are connected in every both ends of the sub bit lines,
wherein respective gate electrodes of the four bank selection transistors are connected with respective separate bank row selection lines.

7. A semiconductor storage device as claimed in claim 5, further comprising two bank selection transistors connected with the bit-line contact, wherein respective gate electrode of the two bank selection transistors are connected with respective separate bank row selection line.

8. A semiconductor storage device as claimed in claim 5, wherein there is provided a plurality of stages of the memory cell transistor in between the first, the second, the third, the fourth, the fifth of the sub bit-lines and the sixth, the seventh, the eighth, the ninth, the tenth of sub bit-lines.

9. A semiconductor storage device in which there is provided one primary bit line and two virtual GND lines within one memory cell array, comprising:
a virtual GND contact for connecting electrically the memory cell array with the virtual GND line;
a bank selection transistor connected with the virtual GND contact;
a bank row selection line for inputting signal to a gate electrode of the bank selection transistor, wherein the bank row selection line causes any one of a plurality of memory cell arrays to be selected by controlling input of the signal; and
a bit-line contact for connecting electrically the primary bit-line with the memory cell array, wherein the one memory cell array is constituted with symmetry with respect to the center line having the bit line contact, further, the respective two virtual GND lines have two virtual GND contacts, furthermore, a virtual GND contact corresponding to the virtual GND contact is connected to the virtual GND contact in the memory cell array adjacent to the memory cell array.

10. A semiconductor storage device as claimed in claim 9, further comprising:
a sub bit-line which is connected with the bit line contact; and
total four bank selection transistors which are connected with both end parts of the sub bit-line in such a way that respective two transistors are connected in every both ends of the sub bit lines,
wherein respective gate electrodes of the four bank selection transistors are connected with respective separate bank row selection lines.

11. A semiconductor storage device as claimed in claim 10, further comprising:
a first, a second, a third, a fourth, a fifth, a sixth, a seventh, an eighth, a ninth, and a tenth sub bit-lines in parallel to the primary bit lines; and
a plurality of stages of the memory cell transistor provided in between each of the first, the second, the third, the fourth, the fifth, sub bit-line and each of the sixth, the seventh, the eighth, the ninth, the tenth, sub bit-line,
wherein the first, the third, the fifth, the sixth, the eighth, and the tenth of the sub bit-lines are connected with respective separate the bank selection transistors.

12. A semiconductor storage device as claimed in claim 10, wherein there is provided a plurality of stages of the memory cell transistor in between the first, the second, the third, the fourth, the fifth of the sub bit-lines and the sixth, the seventh, the eighth, the ninth, the tenth of sub bit-lines.

13. A semiconductor storage device as claimed in claim 11, wherein there is provided a plurality of stages of the memory cell transistor in between the first, the second, the third, the fourth, the fifth of the sub bit-lines and the sixth, the seventh, the eighth, the ninth, the tenth of sub bit-lines.

14. A semiconductor storage device as claimed in claim 9, further comprising two bank selection transistors connected with the bit-line contact, wherein respective gate electrode of the two bank selection transistors are connected with respective separate bank row selection line.

15. A semiconductor storage device as claimed in claim 14, further comprising:
a first, a second, a third, a fourth, a fifth, a sixth, a seventh, an eighth, a ninth, and a tenth sub bit-lines in parallel to the primary bit lines; and a plurality of stages of the memory cell transistor provided in between each of the first, the second, the third, the fourth, the fifth, sub bit-line and each of the sixth, the seventh, the eighth, the ninth, the tenth, sub bit-line, wherein the first, the third, the fifth, the sixth, the eighth, and the tenth of the sub bit-lines are connected with respective separate the bank selection transistors.

16. A semiconductor storage device as claimed in claim 14, wherein there is provided a plurality of stages of the memory cell transistor in between the first, the second, the third, the fourth, the fifth of the sub bit-lines and the sixth, the seventh, the eighth, the ninth, the tenth of sub bit-lines.

17. A semiconductor storage device as claimed in claim 15, wherein there is provided a plurality of stages of the memory cell transistor in between the first, the second, the third, the fourth, the fifth of the sub bit-lines and the sixth, the seventh, the eighth, the ninth, the tenth of sub bit-lines.

18. A semiconductor storage device as claimed in claim 9, further comprising:
   a first, a second, a third, a fourth, a fifth, a sixth, a seventh, an eighth, a ninth, and a tenth sub bit-lines in parallel to the primary bit lines; and
   a plurality of stages of the memory cell transistor provided in between each of the first, the second, the third, the fourth, the fifth, sub bit-line and each of the sixth, the seventh, the eighth, the ninth, the tenth, sub bit-line, wherein the first, the third, the fifth, the sixth, the eighth, and the tenth of the sub bit-lines are connected with respective separate the bank selection transistors.

19. A semiconductor storage device as claimed in claim 18, wherein there is provided a plurality of stages of the memory cell transistor in between the first, the second, the third, the fourth, the fifth of the sub bit-lines and the sixth, the seventh, the eighth, the ninth, the tenth of sub bit-lines.

20. A semiconductor storage device as claimed in claim 9, wherein there is provided a plurality of stages of the memory cell transistor in between the first, the second, the third, the fourth, the fifth of the sub bit-lines and the sixth, the seventh, the eighth, the ninth, the tenth of sub bit-lines.

21. A semiconductor storage device in which there is provided one primary bit line and two virtual GND lines within one memory cell array, comprising:
   a virtual GND contact for connecting electrically the memory cell array with the virtual GND line;
   a bank selection transistor connected with the virtual GND contact;
   a bank row selection line for inputting signal to a gate electrode of the bank selection transistor, wherein the bank row selection line causes any one of a plurality of memory cell arrays to be selected by controlling input of the signal;
   a first, a second, a third, a fourth, a fifth, a sixth, a seventh, an eighth, a ninth, and a tenth sub bit-lines in parallel to the primary bit lines; and
   a plurality of stages of the memory cell transistor provided in between each of the first, the second, the third, the fourth, the fifth, sub bit-line and each of the sixth, the seventh, the eighth, the ninth, the tenth, sub bit-line, wherein the first, the third, the fifth, the sixth, the eighth, and the tenth of the sub bit-lines are connected with respective separate bank selection transistors.

22. A semiconductor storage device as claimed in claim 21, wherein there is provided a plurality of stages of the memory cell transistor in between the first, the second, the third, the fourth, the fifth of the sub bit-lines and the sixth, the seventh, the eighth, the ninth, the tenth of sub bit-lines.

23. A semiconductor storage device in which there is provided one primary bit line and two virtual GND lines within one memory cell array, comprising:
   a virtual GND contact for connecting electrically the memory cell array with the virtual GND line;
   a bank selection transistor connected with the virtual GND contact;
   a bank row selection line for inputting signal to a gate electrode of the bank selection transistor, wherein the bank row selection line causes any one of a plurality of memory cell arrays to be selected by controlling input of the signal;
   a sub bit-line which is connected with the bit line contact;
   a total of four bank selection transistors which are connected with both end parts of the sub bit-line in such a way that respective two transistors are connected to both ends of the sub bit-lines, wherein respective gate electrodes of the four bank selection transistors are connected with respective separate bank row selection lines;
   a first, a second, a third, a fourth, a fifth, a sixth, a seventh, an eighth, a ninth, and a tenth sub bit-lines in parallel to the primary bit lines; and
   a plurality of stages of the memory cell transistor provided in between each of the first, the second, the third, the fourth, the fifth sub bit-line and each of the sixth, the seventh, the eighth, the ninth, and the tenth sub bit-line,
   wherein the first, the third, the fifth, the sixth, the eighth, and the tenth sub bit-lines are connected with respective separate bank selection transistors.

24. A semiconductor storage device as claimed in claim 23, wherein there is provided a plurality of stages of the memory cell transistor in between the first, the second, the third, the fourth, the fifth of the sub bit-lines and the sixth, the seventh, the eighth, the ninth, the tenth of sub bit-lines.

25. A semiconductor storage device in which there is provided one primary bit line and two virtual GND lines within one memory cell array, comprising:
   a virtual GND contact for connecting electrically the memory cell array with the virtual GND line;
   a bank selection transistor connected with the virtual GND contact;
   a bank row selection line for inputting signal to a gate electrode of the bank selection transistor, wherein the bank row selection line causes any one of a plurality of memory cell arrays to be selected by controlling input of the signal;
   two bank selection transistors connected with the bit-line contact, wherein a respective gate electrode of the two bank selection transistors is connected with a respective separate bank row selection line;
   a first, a second, a third, a fourth, a fifth, a sixth, a seventh, an eighth, a ninth, and a tenth sub bit-lines in parallel to the primary bit lines; and
   a plurality of stages of the memory cell transistor provided in between each of the first, the second, the third, the fourth, and the fifth sub bit-line and each of the sixth, the seventh, the eighth, the ninth, and the tenth sub bit-line,
   wherein the first, the third, the fifth, the sixth, the eighth, and the tenth sub bit-lines are connected with respective separate bank selection transistors.

26. A semiconductor storage device as claimed in claim 25, wherein there is provided a plurality of stages of the memory cell transistor in between the first, the second, the third, the fourth, the fifth of the sub bit-lines and the sixth, the seventh, the eighth, the ninth, the tenth of sub bit-lines.

27. A semiconductor storage device in which there is provided one primary bit line and two virtual GND lines within one memory cell array, comprising:

a virtual GND contact for connecting electrically the memory cell array with the virtual GND line;

a bank selection transistor connected with the virtual GND contact;

a bank row selection line for inputting signal to a gate electrode of the bank selection transistor, wherein the bank row selection line causes any one of a plurality of memory cell arrays to be selected by controlling input of the signal;

a sub bit-line which is connected with the bit line contact;

a total of four bank selection transistors which are connected with both end parts of the sub bit-line in such a way that respective two transistors are connected to both ends of the sub bit-lines, wherein respective gate electrodes of the four bank selection transistors are connected with respective separate bank row selection lines; and a plurality of stages of the memory cell transistor in between the first, the second, the third, the fourth, and the fifth sub bit-lines and the sixth, the seventh, the eighth, the ninth, and the tenth sub bit-lines.

28. A semiconductor storage device in which there is provided one primary bit line and two virtual GND lines within one memory cell array, comprising:

a virtual GND contact for connecting electrically the memory cell array with the virtual GND line;

a bank selection transistor connected with the virtual GND contact;

a bank row selection line for inputting signal to a gate electrode of the bank selection transistor, wherein the bank row selection line causes any one of a plurality of memory cell arrays to be selected by controlling input of the signal;

two bank selection transistors connected with the bit-line contact, wherein a respective gate electrode of the two bank selection transistors is connected with a respective separate bank row selection line; and a plurality of stages of the memory cell transistor in between the first, the second, the third, the fourth, and the fifth sub bit-lines and the sixth, the seventh, the eighth, the ninth, and the tenth sub bit-lines.

* * * * *